(12) United States Patent
Sun

(10) Patent No.: US 9,024,288 B2
(45) Date of Patent: May 5, 2015

(54) ARRAY SUBSTRATE AND MANUFACTURING METHOD THEREOF, DISPLAY DEVICE

(71) Applicant: BOE Technology Group Co., Ltd., Beijing (CN)

(72) Inventor: Tuo Sun, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 14/041,151

(22) Filed: Sep. 30, 2013

(65) Prior Publication Data

US 2014/0091280 A1 Apr. 3, 2014

(30) Foreign Application Priority Data

Sep. 29, 2012 (CN) .......................... 2012 1 0375092

(51) Int. Cl.
*H01L 29/06* (2006.01)
*H01L 47/00* (2006.01)
(Continued)

(52) U.S. Cl.
CPC ............ *H01L 33/0041* (2013.01); *H01L 21/77* (2013.01); *Y10S 257/911* (2013.01); *Y10S 438/982* (2013.01)

(58) Field of Classification Search
USPC ............... 257/9, 5, 72, 88, 258, 59, 291, 390, 257/443, 658, E27.076, E27.133, E21.411, 257/E29.273, 911; 438/34, 80, 128, 587, 438/982, 158
See application file for complete search history.

(56) References Cited

U.S. PATENT DOCUMENTS 7,687,308 B2 * 3/2010 Parikh et al. .................... 438/99
7,923,305 B1 * 4/2011 Nguyen et al. ................ 438/128

(Continued)

FOREIGN PATENT DOCUMENTS

| CN | 101986145 A | 3/2011 |
|---|---|---|
| CN | 102468340 A | 5/2012 |
| CN | 102629759 A | 8/2012 |

OTHER PUBLICATIONS

The State Intellectual Property Office of the People'S Republic of China ("SIPO") (Chinese Language) Office Action issued on Mar. 3, 2014 by SIPO in Chinese Patent Application No. 201210375092.2; ten (10) pages.

(Continued)

*Primary Examiner* — Evan Pert
*Assistant Examiner* — Gustavo Ramallo

(57) ABSTRACT

Embodiments of the present invention provide an array substrate, a manufacturing method thereof and a display device. The manufacturing method of an array substrate, comprising: forming a gate electrode on a base substrate by a first patterning process, and then depositing a gate insulating layer on the base substrate on which the gate electrode is formed; forming source and drain electrodes on the base substrate obtained after the above step, by a second patterning process; forming an active layer formed of a graphene layer, and a protective layer disposed on the active layer, on the base substrate obtained after the above steps, by a third patterning process; and forming a planarizing layer on the base substrate, obtained after the above steps, by a fourth patterning process, in which the planarizing layer is provided with a through hole through which the source or drain electrode is exposed.

20 Claims, 2 Drawing Sheets

(51) Int. Cl.
*H01L 29/04* (2006.01)
*H01L 29/10* (2006.01)
*H01L 31/00* (2006.01)
*H01L 27/14* (2006.01)
*H01L 29/00* (2006.01)
*H01L 29/15* (2006.01)
*H01L 29/18* (2006.01)
*H01L 33/00* (2010.01)
*H01L 29/20* (2006.01)
*H01L 27/146* (2006.01)
*H01L 21/00* (2006.01)
*H01L 21/82* (2006.01)
*H01L 21/84* (2006.01)
*H01L 21/3205* (2006.01)
*H01L 21/4763* (2006.01)
*H01L 21/77* (2006.01)

(56) References Cited

U.S. PATENT DOCUMENTS

| | | | |
|---|---|---|---|
| 8,023,310 B2 * | 9/2011 | Fu et al. | 365/148 |
| 8,164,089 B2 * | 4/2012 | Wu et al. | 257/40 |
| 8,193,455 B2 * | 6/2012 | Marinero | 174/257 |
| 8,330,194 B2 * | 12/2012 | Sato | 257/291 |
| 8,358,530 B2 * | 1/2013 | Kamata | 365/149 |
| 8,455,365 B2 * | 6/2013 | Guo et al. | 438/745 |
| 8,541,266 B2 * | 9/2013 | Yamazaki | 438/149 |
| 8,546,181 B2 * | 10/2013 | Yamazaki | 438/104 |
| 8,709,922 B2 * | 4/2014 | Koezuka et al. | 438/482 |
| 2011/0084252 A1 * | 4/2011 | Wu et al. | 257/40 |
| 2011/0111552 A1 | 5/2011 | Jou | |
| 2012/0119211 A1 * | 5/2012 | Lin et al. | 257/57 |
| 2013/0082241 A1 * | 4/2013 | Kub et al. | 257/21 |
| 2013/0153911 A1 * | 6/2013 | Zhang et al. | 257/59 |
| 2014/0061590 A1 * | 3/2014 | Lee et al. | 257/29 |
| 2014/0091280 A1 * | 4/2014 | Sun, Tuo | 257/29 |

OTHER PUBLICATIONS

Translation of SIPO Rejection Decision of Chinese Patent Application No. 201210375092.2; issued on Mar. 3, 2014, eight (8) pages.
English translation of CN102468340A, 22 pages, issued on Jun. 11, 2014.
English translation of CN102629579A, 11 pages, issued on Jun. 11, 2014.
English translation of CN101986145A, 27 pages, issued on Jun. 11, 2014.
Second Office Action issued by the Chinese Patent Office for Chinese Patent Application No. 201210375092.2 dated Oct. 10, 2014, 9pgs.
English translation of Second Office Action issued by the Chinese Patent Office for Chinese Patent Application No. 201210375092.2 dated Oct. 10, 2014, 10pgs.
Rejection Decision (Chinese language) issuedby the State Intellectual Property Office ("SIPO") on Dec. 29, 2014 for International Application No. 201210375092.2, 10 pages.
English translation of Rejection Decision issued by SIPO (listed above) for International Application No. 201210375092.2, 12 pages.

* cited by examiner

US 9,024,288 B2

ARRAY SUBSTRATE AND MANUFACTURING METHOD THEREOF, DISPLAY DEVICE

CROSS REFERENCE TO RELATED APPLICATIONS

This application claims priority from Chinese National Application No. 201210375092.2 filed on Sep. 29, 2012, the contents of which are incorporated herein by reference.

TECHNICAL FIELD

Embodiments of the present invention relate to an array substrate, a manufacturing method thereof and a display device.

BACKGROUND

In the last century, metal-oxide-semiconductor (MOS) field effect transistor (FET) represented by a silicon transistor has greatly promoted the industrialized development of the FET. Graphene, found by Professor Geim of the University of Manchester in 2004, is a two-dimensional honeycomb-like structure of carbon formed by close packing monolayer carbon atom. An intrinsic electron mobility of the graphene at room temperature can reach 200,000 $cm^2/Vs$, which is 140 times of that of Si (about 1,400 $cm^2/Vs$), 20 times of that of GaAs (about 8,500 $cm^2/Vs$), and 100 times of that of GaN (about 2,000 $cm^2/Vs$). Due to its superior electrical performances, the graphene has significant application value in fields of ultra-high frequency (UHF) and even terahertz electronic devices and supercomputer Due to characteristics of high migration and high transmittance, the graphene can be adopted as an active layer material of a new generation active matrix display device. However, as the graphene has a relatively fragile structure and tends to be affected by subsequent processes, for instance, being affected by high-energy processes such as magnetron sputtering or being affected by a patterning process using a photoresist (the photoresist contacting the graphene may affect the graphene) and the like, the electrical performances of the graphene can be reduced.

SUMMARY

Embodiments of the present invention provide an array substrate, a manufacturing method thereof and a display device, which avoid a disadvantageously impact of manufacturing processes on the electrical performances of the graphene configured to form an active layer and improve the electrical performances of the graphene.

In one aspect, an embodiment of the present invention provides a manufacturing method of an array substrate, comprising: forming a gate electrode on a base substrate by a first patterning process, and then depositing a gate insulating layer on the base substrate on which the gate electrode is formed; forming source and drain electrodes on the base substrate obtained after the above step, by a second patterning process; forming an active layer formed of a graphene layer, and a protective layer disposed on the active layer, on the base substrate obtained after the above steps, by a third patterning process; and forming a planarizing layer on the base substrate, obtained after the above steps, by a fourth patterning process, in which the planarizing layer is provided with a through hole through which the source or drain electrode is exposed.

In another aspect, an embodiment of the present invention provides an array substrate, comprising: a base substrate; a gate electrode, formed on the base substrate; a gate insulating layer, formed on the base substrate on which the gate electrode is formed; source and drain electrodes, formed on the base substrate on which the gate electrode and the gate insulating layer are formed; an active layer, formed on the base substrate on which the source and drain electrodes are formed, in which the active layer is a graphene layer; and a protective layer, conformally formed together with the graphene layer and disposed on a surface of the active layer far away from the base substrate.

In still another aspect, an embodiment of the present invention provides a display device, comprising: an array substrate as mentioned above; and a counter substrate, facing the array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
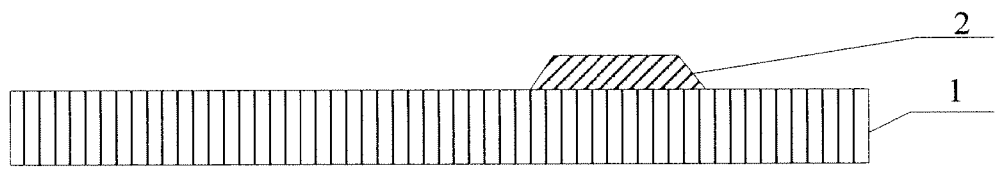
FIG. 1 is a cross-sectional view of an array substrate obtained after a gate electrode is formed in a manufacturing method of an array substrate according to a first embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

It should be noted that: in the drawings, for convenience of description, the thickness of layers and areas has been amplified, and the size and the scale do not represent the actual size and the actual scale. The drawings are schematic diagrams of idealized embodiments of the present invention. The embodiments of the present invention should not be deemed to be only limited to the given shapes of the areas as shown in the figure but include the obtained shapes, for instance, the deviation caused by manufacturing. Those illustrated in the figure are illustrative and should not be deemed to limit the scope of the present invention. And meanwhile, in the following description, the term "substrate" may be understood to include a semiconductor substrate being subjected to processing and may include other film layers prepared thereon.

A First Embodiment

The first embodiment of the present invention provides a manufacturing method of an array substrate. The manufacturing method of the array substrate adopts six patterning processes. FIGS. 1-8 are cross-sectional views of array substrates obtained in various steps of the manufacturing method of the array substrate according to the embodiment of the present invention. With reference to FIGS. 1-8, detailed description is given below to the manufacturing method. The manufacturing method specifically comprises the following steps:

Step 1: forming a gate electrode 2 on a base substrate 1 by a first patterning process, and then depositing a gate insulating layer 3 on the base substrate 1 on which the gate electrode 2 is formed.

Exemplarily, the step 1 comprises the following steps:

Step 11: depositing a gate metal layer on the base substrate 1 such as a glass substrate 1, by conventional methods, such as a magnetron sputtering method or a thermal evaporation method.

Herein, the gate metal layer is made of a conventional metal in the art, for example, molybdenum.

Alternatively, a silicon dioxide and silicon nitride composite layer may be deposited on the base substrate 1 by a plasma enhanced chemical vapor deposition (PECVD) method firstly before depositing the gate metal layer.

Step 12: forming the gate electrode 2 by the first patterning process adopting a mask.

Exemplarily, the step 12 comprises the following steps of:

Spin-coating a photoresist layer on the gate metal layer, and then performing exposure and development treatments by using the mask; patterning the gate metal layer by one etching process, for example, by wet etching adopting an acid etching solution; and finally removing a residual photoresist and thus finishing the first patterning process to form the gate electrode 2, as illustrated in FIG. 1.

Figure 2:
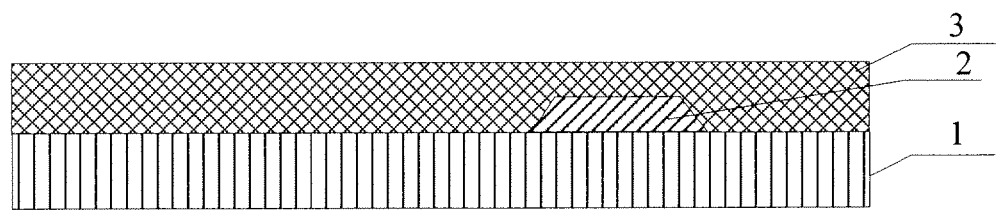
FIG. 2 is a cross-sectional view of an array substrate obtained after an insulating layer is formed in the manufacturing method of the array substrate according to the first embodiment of the present invention.

Step 13: depositing the gate insulating layer 3 on the gate electrode 2, as illustrated in FIG. 2. Exemplarily, the gate insulating layer 3 is deposited on the gate electrode 2 by a PECVD method. The gate insulating layer 3 may be a silicon dioxide layer, a silicon nitride layer or a stacking structure of silicon dioxide and silicon nitride.

Step 2: forming source and drain electrodes 4 on the base substrate obtained after the step 1 is finished, by a second patterning process.

Exemplarily, the step 2 comprises the following steps.

Step 21: depositing a source and drain metal layer on the base substrate 1 on which the gate electrode 2 and the gate insulating layer 3 are formed, by conventional methods such as a magnetron sputtering method.

Herein, the source and drain metal layer may be, for example, a stacking layer of molybdenum/aluminum neodymium/molybdenum or titanium/aluminum/titanium. Of course, the source and drain metal layer may be also a monolayer formed by other metals such as copper and the like.

Figure 3:
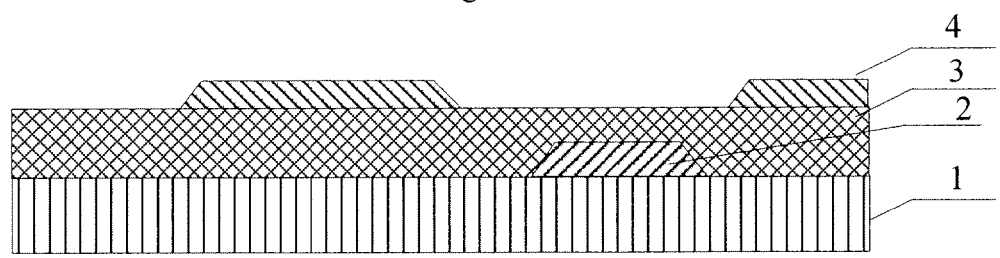
FIG. 3 is a cross-sectional view of an array substrate obtained after source and drain electrodes are formed in the manufacturing method of the array substrate according to the first embodiment of the present invention.

Step 22: forming the source and drain electrodes 4 by the second patterning process adopting a mask, as illustrated in FIG. 3.

Exemplarily, the step 22 comprises the following steps of:

Spin-coating a photoresist layer on the source and drain metal layer, and then performing exposure and development treatments by using the mask; patterning the source and drain metal layer by one etching process, for example, by wet etching adopting an acid etching solution; and finally removing a residual photoresist and thus finishing the second patterning process to form the source and drain electrodes 4.

Step 3: forming an active layer formed of a graphene layer 5, and a protective layer 6 disposed on the active layer, on the base substrate obtained after the step 2, by a third patterning process.

Exemplarily, the step 3 comprises the following steps:

Step 31: preparing a graphene layer film 51.

Figure 4:
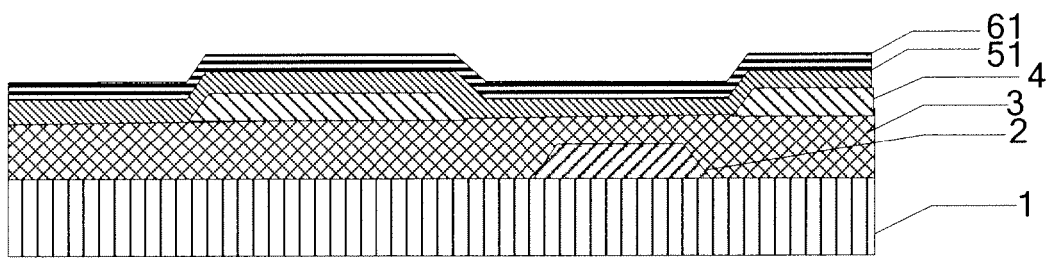
FIG. 4 is a cross-sectional view of an array substrate obtained after a graphene layer film and a protective layer film are formed in the manufacturing method of the array substrate according to the first embodiment of the present invention.
Figure 5:
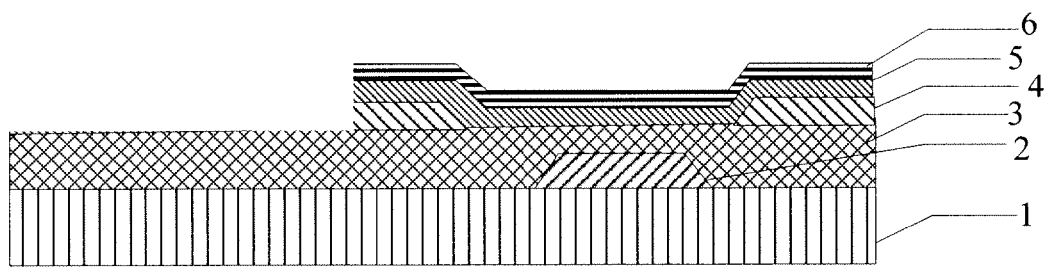
FIG. 5 is a cross-sectional view of an array substrate obtained after a graphene channel protective composite layer is formed in the manufacturing method of the array substrate according to the first embodiment of the present invention.

Exemplarily, the step 31 comprises the following steps of:

depositing the graphene layer film on a temporary carrier (for example, a glass substrate) by a chemical vapor deposition (CVD) method; and transferring the graphene layer film to the base substrate 1 on which the source and drain electrodes 4 are formed, exemplarily, wherein during transferring the graphene layer film, polymethyl methacrylate (PMMA) or poly dimethyl siloxane (PDMS) is taken as a transferring medium to bond the graphene layer film at first, then the graphene layer film is peeled off from the glass substrate taken as the temporary carrier and transferred to the base substrate 1, on which the source and drain electrodes 4 are formed by the second patterning process, and finally, the transferring medium is removed to form the graphene layer film 51, as illustrated in FIG. 4.

Exemplarily, the transferring the graphene layer film comprises the following steps of:

spin-coating a polymethyl methacrylate (PMMA) layer or a poly dimethyl siloxane (PDMS) layer on a surface of the graphene layer film formed on the temporary carrier;

drying the PMMA or PDMS layer spin-coated on the surface of the graphene layer film at a temperature of 50° C.~100° C.;

immersing the dried graphene layer film into an corrosion solution, for example, a 15% HF solution, in which the glass substrate is disposed downwards and the PMMA or PDMS layer is disposed upwards, during immersing, and the corrosion solution should adopt a solution having corrosiveness on the glass substrate;

after the glass substrate is etched away by the corrosion solution, cleaning a combination of the graphene layer film and the PMMA or PDMS layer by using a deionized water, to remove a residual etching solution, in which during the cleaning, the PMMA or PDMS layer should be guaranteed to be disposed upwards and the graphene layer film should be guaranteed to be disposed downwards;

uniformly spreading a cleaned combination of the graphene layer film and the PMMA or PDMS layer on the base substrate on which the source and drain electrodes 4 are formed, in which the graphene layer film is attached to a surface of the base substrate on which the source and drain electrodes 4 are formed, and then drying the graphene layer film at a temperature of 60° C.~100° C.; and removing the PMMA or PDMS layer on the surface of the graphene layer film by a immersion or steam method using a removing solution, for example, 20 wt % tetramethyl ammonium hydroxide (TMAH), and thus, obtaining the graphene layer film 51 transferred to the surface of the base substrate on which the source and drain electrodes 4 are formed.

Herein, it should be noted that the word "downwards" described in the step of immersing the dried graphene layer film into the corrosion solution refers to facing to a bottom of a container for holding the corrosion solution, and the word "upward" refers to being far away from the bottom of the container.

Alternatively, the graphene layer film 51 transferred to the surface of the base substrate on which the source and drain electrodes 4 are formed may be doped by gas diffusion under the condition of heating, in which an ammonia gas ($NH_3$, n-type dopant) or a phosphine ($PH_3$, p-type dopant) may be adopted as a dopant.

Step 32: depositing a protective layer film 61, in which the obtained base substrate 1 is as illustrated in FIG. 4; the protective layer film 61 is deposited on the graphene layer film 51 which is not doped or doped by a PECVD method and the like; and the protective layer film 61 may be made of any one material selected from a group consisting of $SiO_2$, $Si_3N_x$, $Al_2O_3$, $HfO_2$ and $ZrO_2$ and may also be made of a mixture of two or more from the group.

The depositing process by using a PECVD method is illustrated below by taking the protective layer film 61 made of $SiO_2$ as example:

cleaning the base substrate 1 on which the graphene layer film 51 is formed, and placing the base substrate 1 into a reaction chamber of a RF inductively coupled plasma enhanced chemical vapor deposition apparatus, in which a vacuum degree of the reaction chamber is $2\times10^{-2}$~$3\times10_{-3}$ Pa; heating the base substrate 1 so that a temperature of the base substrate 1 is 150° C.~300° C.; taking $SiH_4$ with a volume concentration of 5~20% and $O_2$ with the volume concentration of 10~40% after diluted by $H_2$ ($H_2$ is referred as a carrier gas) as a reaction source gases, and respectively inputting the two source gases into a buffer chamber of the RF inductively coupled plasma enhanced chemical vapor deposition apparatus under the control of a flowmeter; fully mixing the two source gases in the buffer chamber under the carrying of the carrier gas, and introducing the mixed gas into a vacuum reaction chamber at a flow rate of 15~50 standard-state cubic centimeter per minute; and producing glow for reaction under a pressure of 2~10 Pa and a radio frequency power is 50 W~300 W, and depositing a $SiO_2$ film on the base substrate 1 to form the protective layer film 61.

The depositing process by using a electron beam evaporation method is illustrated below by taking the protective layer film 61 made of $Si_3N_x$ as example. The specific process parameters are as follows: a distance from a film material $Si_3N_4$ to the surface of the base substrate is 15~20 cm; a temperature of the base substrate is 150° C.~250° C.; a vacuum degree is $4\times10^{-5}$~$7\times10^{-5}$ torr; a bombarding current of a electron gun is 3.8~4.0 A; and a acceleration voltage is 4,500~5,500V.

Step 33: patterning the graphene layer film and the protective layer film to form a graphene channel protective composite layer after the protective layer film 61 is formed.

Exemplarily, the step 33 comprises the following steps of:

spin-coating a photoresist layer on the protective layer film 61; performing exposure and development treatments by using a mask; patterning the graphene layer film 51 and the protective film layer 61 by, for example, a dry etching, in which in a etching process, parts of the graphene layer film 51 and the protective film layer 61 are etched away at the same time, and thus, a graphene layer 5 and a protective layer 6 are simultaneously and conformally formed, that is, the protective layer 6 always covers a surface of the graphene layer 5, so that a case that the graphene layer is polluted by the photoresist can be avoided; and finally removing the photoresist to form the graphene channel protective composite layer. That is to say, the graphene layer is taken as an active layer of a thin-film transistor (TFT); the protective layer is disposed on the graphene layer; and a composite structure of the graphene layer and the protective layer is referred as the "graphene channel protective composite layer".

Step 4: forming a planarizing layer 7 by a fourth patterning process.

Figure 6:
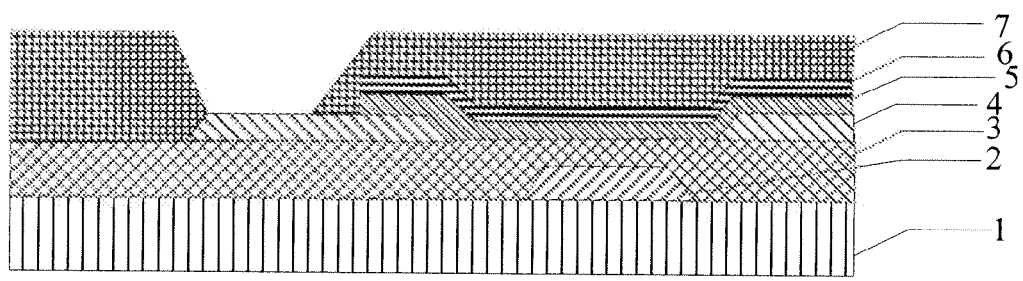
FIG. 6 is a cross-sectional view of an array substrate obtained after a planarizing layer is formed in the manufacturing method of the array substrate according to the first embodiment of the present invention.

Exemplarily, the step 4 comprises the following steps of:

spin-coating a planarizing layer film made of, for example, PMMA, on the base substrate 1 on which the graphene channel protective composite layer is formed, in which the planarizing layer film may also be made of other acrylic materials, namely, acrylic resin, such as, a copolymer of methyl methacrylate and butyl methacrylate; and forming the planarizing layer 7 provided with a through hole by the fourth patterning process, as illustrated in FIG. 6, in which specific operations of the fourth patterning process are the same with those of the first patterning process and will not be further described herein for simplicity.

Step 5: forming an anode 8 by a fifth patterning process.

Figure 7:
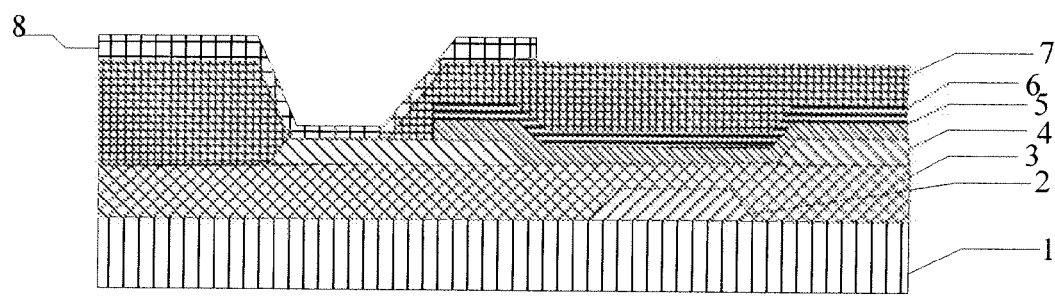
FIG. 7 is a cross-sectional view of an array substrate obtained after an anode or a pixel electrode is formed in the manufacturing method of the array substrate according to the first embodiment of the present invention.

Exemplarily, the step 5 comprises the following steps of:

forming an anode layer of an organic light-emitting diode (OLED) by, for example, a magnetron sputtering method, on the base substrate 1 on which the planarizing layer 7 is formed, in which the anode layer may be a transparent conductive layer, for example, an indium tin oxide (ITO) layer or a stacking layer of ITO/Ag/ITO; and forming the anode 8 by the fifth patterning process adopting a mask, as illustrated in FIG. 7, in which the anode 8 is connected with the drain electrode. Specific operations of the fifth patterning process are the same with those of the first patterning process and will not be further described herein for simplicity.

Step 6: forming a pixel defining layer by a sixth patterning process.

Figure 8:
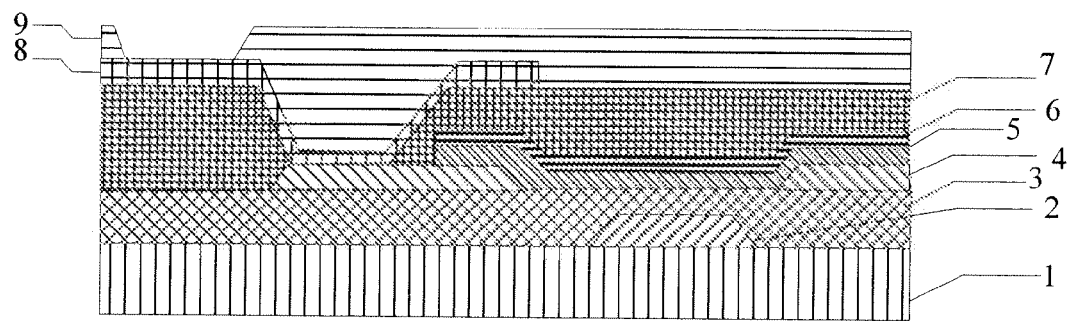
FIG. 8 is a cross-sectional view of an array substrate obtained after a pixel defining layer is formed in the manufacturing method of the array substrate according to the first embodiment of the present invention.

Exemplarily, the step 6 comprises the following steps of:

spin-coating PMMA on the base substrate 1 on which the anode 8 is formed, in which of course, other acrylic materials may be also adopted; and forming the pixel defining layer 9 by the sixth patterning process, as illustrated in FIG. 8, in which the pixel defining layer 9 is configured to form regular pixels. Specific operations of the sixth patterning process are the same with those of the first patterning process and will not be further described herein for simplicity.

Although the manufacturing method of the array substrate provided by the embodiment of the present invention has been described above in detail by taking the manufacturing of the array substrate of an OLED device as example, it should be understood by those skilled in the art that the manufacturing method of the array substrate provided by the embodiment of the present invention may be also used for manufacturing an array substrate of a liquid crystal display (LCD) device. The two manufacturing methods are substantially the same and only have slight differences. For example, a pixel electrode, not the anode, is formed in the step 5; and a passivation layer, not the pixel defining layer, is formed in the step 6. Herein, the manufacturing method of the array substrate of the LCD device will not be further described for simplicity.

Moreover, it should be noted by those skilled in the art that: the method provided by the embodiment is only one of the specific methods for manufacturing the array substrate, and various changes can be also made to the method by those skilled in the art: for instance, the array substrate may be also manufactured by other known processes (if the specific structure of a TFT in the array substrate is varied; for instance, the TFT may be a top-gate TFT); or alternatively, the array substrate may be also manufactured by known processes such as four patterning processes and five patterning processes (of course, the specific structure of the obtained array substrate is also varied); and a material, a manufacturing process and process parameters of the protective layer may be varied as well. However, as long as the step of forming the protective layer on the graphene layer is contained, the variations also fall within the protection scope of the embodiments of the present invention.

Experimental Results

Herein, the array substrate manufactured according to the embodiment and an array substrate manufactured by the prior art are compared, in which six examples of the array substrate manufactured according to the embodiment of the present invention are given; a comparative example is the array substrate manufactured by the prior art. Base substrates in the comparative example and the six examples are all glass substrates; gate metal layers are all made of molybdenum; source and drain electrodes are all made of molybdenum/aluminum neodymium/molybdenum; planarizing layers are all made of PMMA; anodes are all made of ITO; pixel defining layers are all made of PMMA; and other processing steps and parameters are also the same. The difference between the comparative example and the six examples is only as follows: relevant parameters of the protective layer are different. The relevant parameters of the protective layer and the experimental results are as shown in Table 1.

TABLE 1 process parameters and comparison results of the comparative example and the examples

|  | Comparative example | Example 1 | Example 2 | Example 3 |
|---|---|---|---|---|
| protective layer thickness (nm) | None | 50 | 70 | 100 |
| Dopant in the graphene layer | $NH_3$ | $NH_3$ | $PH_3$ | $NH_3$ |
| PECVD parameters of $SiO_2$ | None | a substrate temperature is 150° C.; a reaction chamber pressure is 2 Pa; a mole ratio of $[O_2]/[SiH_4]$ is 0.3; a flow rate of the mixed gas is 150 standard-state ml/min; a RF power is 50 W. | a substrate temperature is 300° C.; a reaction chamber pressure is 10 Pa; the mole ratio of $[O_2]/[SiH_4]$ is 1.5; a flow rate of the mixed gas is 50 standard-state ml/min; a RF power is 300 W. | a substrate temperature is 250° C.; a reaction chamber pressure is 6 Pa; a mole ratio of the gas sources $[O2]/[SiH4]$ is 1.0; a flow rate of the mixed gas is 40 standard-state ml/min; and a RF power is 200 W. |
| process parameters for a electron beam evaporation of $Si_3N_x$ | None | | | |
| Performances | Field effect mobility: <50 $cm^2$/vs | Field effect mobility: 250 $cm^2$/vs | Field effect mobility: 200 $cm^2$/vs (p-type) | Field effect mobility: 300 $cm^2$/vs |
|  | On/off ratio: $10^5$ | On/off ratio: >$10^7$ | On/off ratio: >$10^7$ | On/off ratio: >$10^7$ |
|  | Subthreshold swing: 0.6 v/dec | Subthreshold swing: 0.3 v/dec | Subthreshold swing: 0.4 v/dec | Subthreshold swing: 0.3 v/dec |
| Test method | Calculating TFT transfer curve | Calculating the TFT transfer curve | Calculating the TFT transfer curve | Calculating the TFT transfer curve |

|  | Example 4 | Example 5 | Example 6 |
|---|---|---|---|
| protective layer thickness (nm) | 20 | 30 | 90 |
| Dopant in the graphene layer | $NH_3$ | $NH_3$ | $PH_3$ |
| PECVD parameters of $SiO_2$ | | | |
| process parameters for a electron beam evaporation of $Si_3N_x$ | a distance from the film material to the substrate is 20 cm; a substrate temperature is 250° C.; a vacuum degree is $7 \times 10^{-5}$ torr; an electron gun bombarding current is 3.8 A; a acceleration voltage is 4,500 V | a distance from the film material to the substrate is 18 cm; a substrate temperature is 200° C.; a vacuum degree is $5 \times 10^{-5}$ torr; an electron gun bombarding current is 3.9 A; a acceleration voltage is 5,000 V | a distance from the film material to the substrate is 15 cm; a substrate temperature is 150° C.; a vacuum degree is $4 \times 10^{-5}$ torr; an electron gun bombarding current is 4.0 A; a acceleration voltage is 5,500 V |
| Performances | Field effect mobility: 300 $cm^2$/vs | Field effect mobility: 150 $cm^2$/vs (p-type) | Field effect mobility: 350 $cm^2$/vs |
|  | On/off ratio: >$10^8$ | On/off ratio: >$10^7$ | On/off ratio: >$10^8$ |
|  | Subthreshold swing: 0.2 v/dec | Subthreshold swing: 0.4 v/dec | Subthreshold swing: 0.2 v/dec |
| Test method | Calculating the TFT transfer curve | Calculating the TFT transfer curve | Calculating the TFT transfer curve |

In the manufacturing method of the array substrate provided by the embodiment of the present invention, due to the protective layer, a patterning process on the graphene layer is not to directly treat the graphene layer, and the photoresist does not contact the graphene, and thus, the impact of the patterning process can be greatly avoided; and meanwhile, due to the protective layer, the impact of the subsequent processes on the graphene can be reduced.

In addition, in the manufacturing method of the array substrate provided by the embodiment of the present invention, the graphene is not directly exposed the magnetron sputtering method and does not directly contact the photoresist, so that a case that electrical performances of the graphene are reduced can be effectively avoided; and meanwhile, the array substrate with superior electrical performances can be obtained by the above method.

Moreover, in the manufacturing method of the array substrate provided by the embodiment of the present invention, the protective layer on a surface of the graphene layer is formed by a PECVD method or an electron beam evaporation method. The two methods are the methods with the mildest process conditions in the methods for forming the protective layer. Therefore, the impact of a process for forming the protective layer on the performances of the graphene can be minimized.

Furthermore, in the manufacturing method of the array substrate provided by the embodiment of the present invention, the patterning process of the graphene layer adopts a dry etching. Compared with a wet etching, the impact of an etching process on the performances of the graphene can be greatly reduced.

Still furthermore, the manufacturing method of the array substrate provided by the embodiment of the present invention may be also applied to samples which is self-supporting and is subject to be damaged by processes such as a magnetron sputtering method, for example, a carbon nanotube thin film. The method can produce a new generation of display panel without special upgrade of a current production line.

A Second Embodiment

The second embodiment of the present invention provides an array substrate, which is manufactured by the method according to the first embodiment. The array substrate comprises: a base substrate; a gate electrode, formed on the base substrate; a gate insulating layer, formed on the base substrate on which the gate electrode is formed; source and drain electrodes, formed on the base substrate on which the gate electrode and the gate insulating layer are formed; an active layer, being a graphene layer and formed on the base substrate on which the source and drain electrodes are formed; and a protective layer, simultaneously and conformally formed with the graphene layer and disposed on a surface far away from the base substrate of the active layer.

Moreover, the array substrate may further comprise: a planarizing layer, formed on the base substrate on which the active layer is formed and provided with a through hole through which the source or drain electrode is exposed; and a pixel electrode or an anode, formed on the planarizing layer and electrically connected with the source or drain electrode via the through hole, in which the pixel electrode is contained in an array substrate for an LCD device and the anode is contained in an array substrate for an OLED device.

The array substrate for the OLED device may further comprise a pixel defining layer formed on the anode.

Exemplarily, the protective layer is made of any one material taken from a group consisting of $SiO_2$, $Si_3N_x$, $Al_2O_3$, $HfO_2$ and $ZrO_2$ and may also be made of a mixture of two or more from the group.

Exemplarily, a thickness of the protective layer is 20~100 nm.

Exemplarily, the graphene layer is subjected to a doping treatment, in which a ammonia gas ($NH_3$, n-type doping) or a phosphine ($PH_3$, p-type doping) may be adopted as a dopant; or alternatively, the graphene layer is not subjected to the doping treatment.

Exemplarily, the protective layer is formed by a PECVD method or a electron beam evaporation method.

Although the foregoing takes a bottom-gate TFT as example, the embodiment of the present invention is also applied to a top-gate TFT, and an embodiment of the present invention is not limited thereto.

A Third Embodiment

The embodiment provides a display device, which comprises the above mentioned array substrate.

One example of the display device is a liquid crystal display device, wherein the array substrate and an opposite substrate are disposed to face each other to form a liquid crystal cell, and a liquid crystal material is filled in the liquid crystal cell. The opposite substrate is a color filter substrate, for example. A pixel electrode of each pixel unit of the array substrate is used to apply an electric field, so as to control a rotation of liquid crystal material and to perform a displaying operation. In some examples, the liquid crystal display apparatus further comprises a backlight source provided for the array substrate.

Another example of the display device is an organic light emitting display (OLED) device, wherein a pixel electrode of each pixel unit of the array substrate is used as an anode or a cathode to drive organic light-emitting material to emit light so as to perform a displaying operation.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A manufacturing method of an array substrate, comprising:
   forming a gate electrode on a base substrate by a first patterning process, and then forming a gate insulating layer on the base substrate on which the gate electrode is formed;
   forming source and drain electrodes on the base substrate obtained after the above step, by a second patterning process;
   forming an active layer by a graphene layer, and a protective layer disposed on the active layer, on the base substrate obtained after the above steps, by a third patterning process; and
   forming a planarizing layer on the base substrate obtained after the above steps, by a fourth patterning process, in which the planarizing layer is provided with a through hole through which the source or drain electrode is exposed.

2. The manufacturing method of the array substrate according to claim 1, further comprises the following step of:

forming an anode or a pixel electrode on the base substrate obtained after the above steps, by a fifth patterning process.

3. The manufacturing method of the array substrate according to claim 2, further comprises the following step of:
   forming a pixel defining layer on the base substrate, on which the anode is formed, by a sixth patterning process.

4. The manufacturing method of the array substrate according to claim 1, wherein the protective layer is made of any one material selected from a group consisting of $SiO_2$, $Si_3N_x$, $Al_2O_3$, $HfO_2$ and $ZrO_2$, or is made of a mixture of two or more from the group.

5. The manufacturing method of the array substrate according to claim 1, wherein a thickness of the protective layer is 20~100 nm.

6. The manufacturing method of the array substrate according to claim 1, wherein the forming the active layer by the graphene layer and the protective layer disposed on the active layer, on the base substrate obtained after the above steps, by the third patterning process comprises the following steps of:
   preparing a graphene layer film;
   depositing a protective layer film; and
   patterning the graphene layer film and the protective layer film to form a graphene channel protective composite layer by the third patterning process using a mask.

7. The manufacturing method of the array substrate according to claim 6, wherein the preparing the graphene layer film comprises the following steps of:
   depositing the graphene layer film on a temporary carrier by a chemical vapor deposition (CVD) method; and
   transferring the graphene layer film formed on the temporary carrier to the base substrate on which the source and drain electrodes are formed.

8. The manufacturing method of the array substrate according to claim 7, wherein the transferring the graphene layer film formed on the temporary carrier to the base substrate on which the source and drain electrodes are formed comprises the following steps of:
   spin-coating a polymethyl methacrylate (PMMA) layer or a poly dimethyl siloxane (PDMS) layer on a surface of the graphene layer film formed on the temporary carrier;
   drying the PMMA or PDMS layer spin-coated on the surface of the graphene layer film at a temperature of 50° C.~100° C.;
   immersing the dried graphene layer film into an corrosion solution, in which the temporary carrier is disposed downwards and the PMMA or PDMS layer is disposed upwards, during immersing;
   cleaning the graphene layer film after the temporary carrier is etched away by the corrosion solution;
   uniformly spreading a cleaned combination of the graphene layer film and the PMMA or PDMS layer on the base substrate on which the source and drain electrodes are formed, in which the graphene layer film is attached to a surface of the base substrate on which the source and drain electrodes are formed, and then drying the graphene layer film at the temperature of 60° C.~100° C.; and
   removing the PMMA or PDMS layer on the surface of the graphene layer film by a removing solution, and thus, obtaining the graphene layer film transferred to the surface of the base substrate on which the source and drain electrodes are formed.

9. The manufacturing method of the array substrate according to claim 6, wherein the protective layer film is formed by using a plasma enhanced chemical vapor deposition (PECVD) method or a electron beam evaporation method.

10. The manufacturing method of the array substrate according to claim 9, wherein the protective layer film is made of $SiO_2$ and formed by the PECVD method.

11. The manufacturing method of the array substrate according to claim 10, wherein process conditions are as follows: a temperature of the base substrate is 150° C.~300° C.; a vacuum degree of a reaction chamber is $2 \times 10^{-2} \sim 3 \times 10^{-3}$ Pa; a pressure of the reaction chamber of a PECVD method apparatus is 2~10 Pa, $SiH_4$ and $O_2$ are taken as source gases, a volume concentration of the $SiH_4$ in a mixed gas of the source gases and a carrier gas is 5%~20%, and a volume concentration of the $O_2$ in the mixed gas is 10%~40%; a flow rate of the mixed gas is 15~50 standard-state cubic centimeter per minute; and a radio frequency power is 50 W~300 W.

12. The manufacturing method of the array substrate according to claim 9, wherein the protective layer film is made of SiN, and formed by the electron beam evaporation method.

13. The manufacturing method of the array substrate according to claim 12, wherein the process conditions are as follows: a distance from a film material to the surface of the base substrate is 15~20 cm; a temperature of the base substrate is 150° C.~250° C.; a vacuum degree of an electron beam evaporation apparatus is $4 \times 10^{-5} \sim 7 \times 10^{-5}$ torr; a bombarding current of a electron gun is 3.8~4.0 A; and a acceleration voltage is 4,500~5,500V.

14. The manufacturing method of the array substrate according to claim 6, wherein before the depositing the protective layer film, further comprises the following step of:
   performing a doping treatment on the graphene layer film formed on the base substrate, on which the source and drain electrodes are formed, under the condition of heating.

15. The manufacturing method of the array substrate according to claim 14, wherein a ammonia gas or a phosphine is taken as a dopant in the doping treatment.

16. An array substrate, manufactured by the manufacturing method of the array substrate according to claim 1, comprising:
   a base substrate;
   a gate electrode, formed on the base substrate;
   a gate insulating layer, formed on the base substrate on which the gate electrode is formed;
   source and drain electrodes, formed on the base substrate on which the gate electrode and the gate insulating layer are formed;
   an active layer, formed on the base substrate on which the source and drain electrodes are formed, in which the active layer is a graphene layer; and
   a protective layer, conformally formed together with the graphene layer and disposed on a surface of the active layer far away from the base substrate.

17. The array substrate according to claim 16, further comprises:
   a planarizing layer, formed on the base substrate on which the active layer is formed, in which the planarizing layer is provided with a through hole through which the source or drain electrode is exposed; and
   a pixel electrode or an anode, formed on the planarizing layer and electrically connected to the source or drain electrode via the through hole.

18. The array substrate according to claim 17, further comprises:
   a pixel defining layer, formed on the anode.

19. The array substrate according to claim 16, wherein the protective layer is made of any one material selected from a group consisting of $SiO_2$, $Si_3N_x$, $Al_2O_3$, $HfO_2$ and $ZrO_2$, or is made of a mixture of two or more from the group, and a thickness of the protective layer is 20~100 nm.

20. A display device, comprising:
an array substrate according to claim 16; and
a counter substrate, facing the array substrate.

* * * * *